United States Patent [19]

Chu

[11] Patent Number: 5,111,113
[45] Date of Patent: May 5, 1992

[54] MUSIC INITIATED CHRISTMAS LIGHT SET CONTROLLER

[75] Inventor: Ching C. Chu, Taipei, Taiwan
[73] Assignee: Superlite Co., Ltd., Taipei, Taiwan
[21] Appl. No.: 334,167
[22] Filed: Apr. 6, 1989
[51] Int. Cl.$^5$ .............. H05B 37/02; H05B 41/34; H05B 41/30
[52] U.S. Cl. .............. 315/210; 315/220 A; 315/323; 84/464 R; 361/380; 361/392
[58] Field of Search ............ 315/210, 287, 294, 313, 315/317, 200 A, 76, 186, 217, 323, 315, 211; 84/464 R; 340/148

[56] References Cited

U.S. PATENT DOCUMENTS 3,845,468 10/1974 Smith .................................. 340/148
4,890,000 12/1989 Chou ..................................... 307/36

OTHER PUBLICATIONS

J. Gavalda, "A Psychedelic Illuminated Tube for Decoration", Journal Ref.: Rev. Esp. Electron (Spain), vol. 23, No. 263, (Oct. 1976) pp. 38-40.

Primary Examiner—Eugene R. LaRoche
Assistant Examiner—Ali Neyzari
Attorney, Agent, or Firm—Morton J. Rosenberg; David I. Klein

[57] ABSTRACT

A music initiated Christmas light set controller includes a casing in which is disposed a circuit board. The circuit board is connected to a plurality of light sets and includes a bridge rectifier, a voltage regulator circuit, a music generating integrated circuit (IC), a piezo-electric transducer, an alternative switch IC, and a plurality of thyristors. The casing includes a loudspeaker aperture for output of music, a volume control knob connected to a variable resistor for controlling the volume of music, and a knob for alternative selection of the lighting inside. A bridge rectifier is coupled to 110 volt A.C. power for providing full-wave rectification thereof. The output of the bridge rectifier is coupled to a voltage regulation circuit for dropping and filtering the voltage to form a stable voltage for application to a music IC and also provide a signal voltage to an alternative switch IC. The alternative switch IC is triggered by the music rhythm generated by the music IC to provide a selected one of three different outputs utilized to further trigger "on" thyristors wich drive several light sets to twinkle, flash, or be steadily illuminated.

6 Claims, 4 Drawing Sheets

MUSIC INITIATED CHRISTMAS LIGHT SET CONTROLLER

BACKGROUND OF THE INVENTION

The present invention relates to a music initiated Christmas light set controller and, more particularly to a light set controller which controls the lighting condition of various light sets according to the change of music rhythm through the operation of music IC, alternative switch IC and selector switch.

Regular Christmas light sets are normally controlled to flash in a particular sequence or randomly. However, either of the two flashing types is fixed and provides no variation. Such static flashing types are not very attractive and do not provide a desired merrymaking effect. In order to provide a lively and dynamic effect, improvements must be made. Further, known Christmas light set control boxes are normally sealed by means of an adhesive, which makes the manufacturing of the control box much more complicated and time-consuming.

In general, known Christmas light set control boxes have the following drawbacks:

(1) A circuit design which gives little variation in the lighting effect.

(2) Only one flashing effect is usually provided and no dynamic alternation is available.

(3) The assembly of the control box is more complicated and time-consuming.

SUMMARY OF THE INVENTION

The main object of the present invention is to provide a music initiated Christmas light set controller having an AC power supply to produce Christmas music and to drive a plurality of light sets to alternatively twinkle or flash or steadily illuminate in accordance with music rhythm.

Another object of the present invention is to provide a music initiated Christmas light set controller wherein the lighting type and the volume of music both are variable according to respective selection control.

Another object of the present invention is to provide a music initiated Christmas light set controller which minimizes power consumption, and is simple and inexpensive to manufacture.

A yet further object of the present invention is to provide a music initiated Christmas light set controller wherein the housing of the controller is comprised of a casing and cover plate and, wherein the casing and the cover plate are coupled together by means of set-in connection to eliminate the need of an adhesive resin to facilitate its assembly.

The above and other objects, features and advantages of the present invention will become more apparent from the following detailed description quoted on the basis of the annexed drawings as hereunder.

DESCRIPTION OF THE PREFERRED EMBODIMENTS

Figure 1:
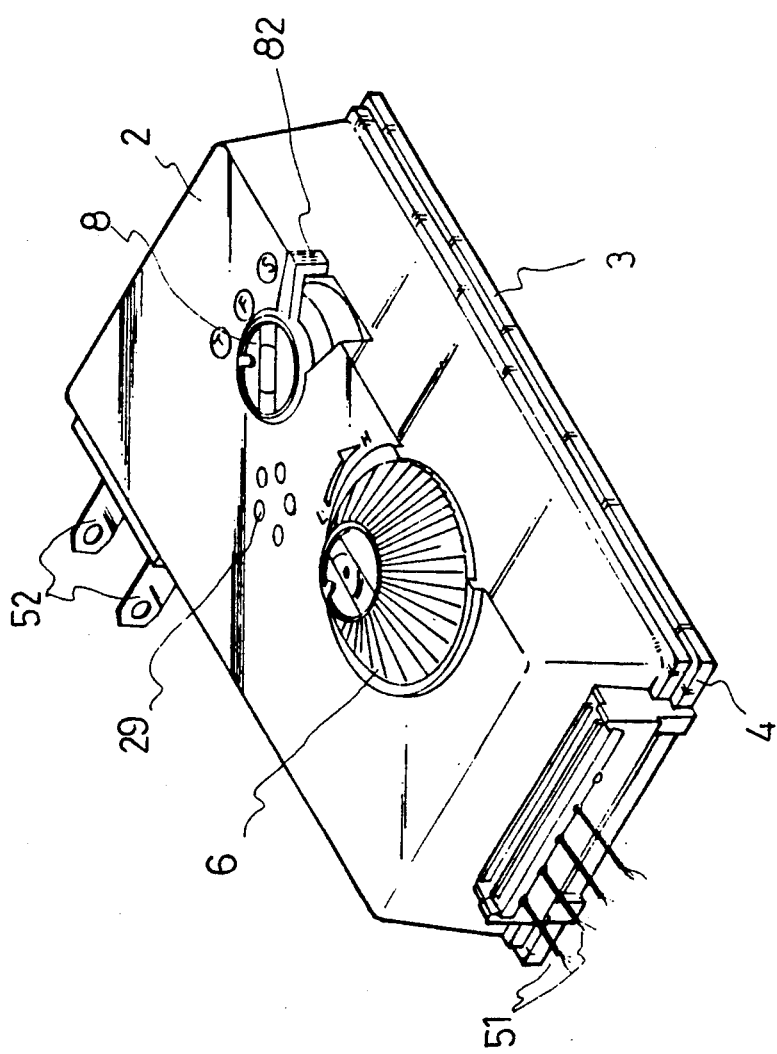
FIG. 1 is a perspective view of a music initiated Christmas light set controller embodying the present invention.
Figure 2:
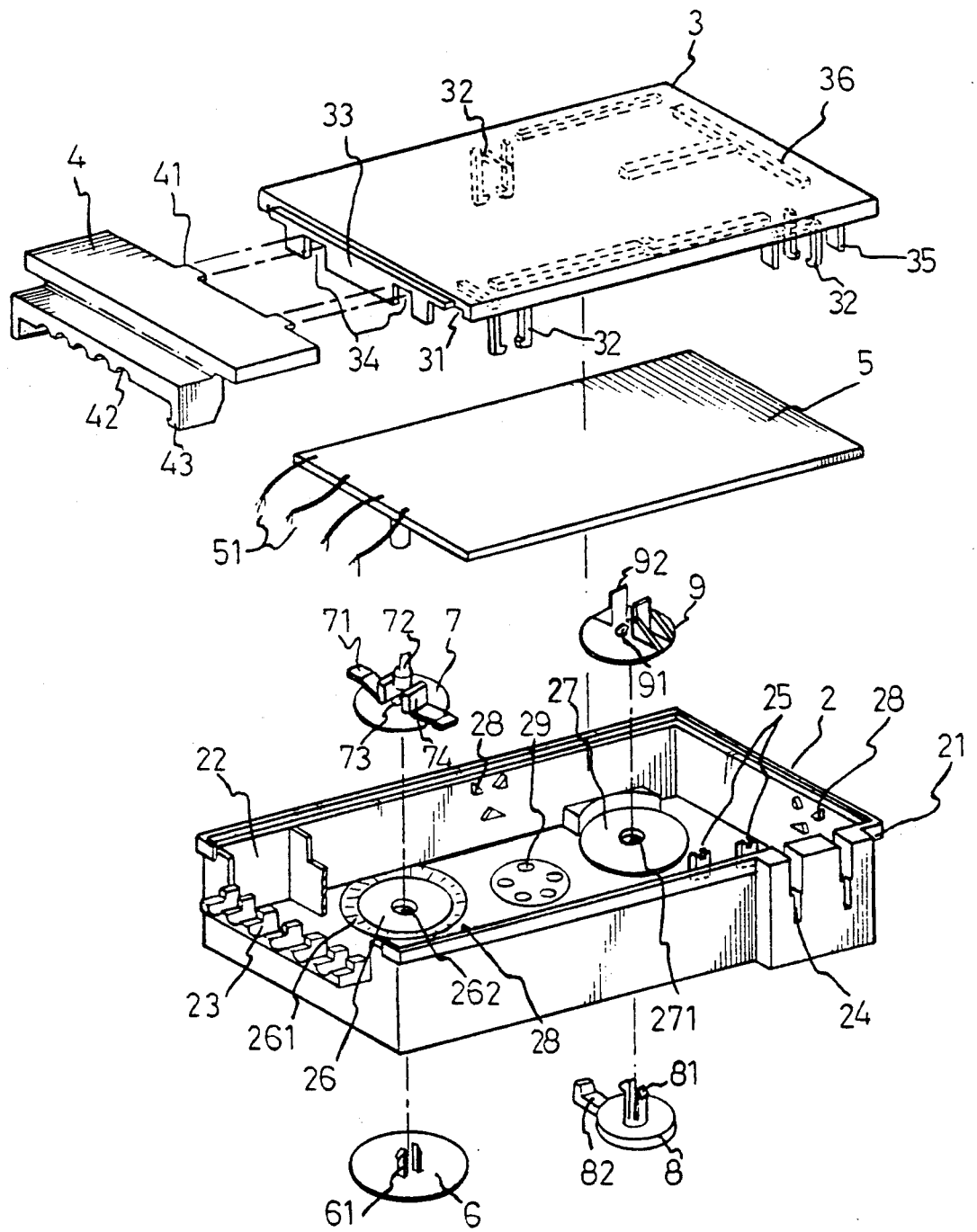
FIG. 2 is a perspective exploded view of the said preferred embodiment of the present invention.

Referring to FIGS. 1 and 2, a music initiated Christmas light set controller includes a casing 2, a cover plate 3, a front cover 4, and a circuit board 5.

The casing 2 includes a flange 21 formed around its top circumference, with a recess formed at one side to define a plurality of guide notches 23 for respective insertion therethrough of electric wires. A compartment 22 is defined in the casing 2 by the side of the guide notches 23 for arrangement of the electric wires 51 from the circuit board 5. Two parallel and stepped guide slots 24 are formed at one lateral side of the casing 2 for passage of two conductive plates 52 through the lower narrower portions respectively to provide a plug for insertion into an A.C. outlet. Two locating stands 25 are formed inside the casing 2 at a position to align with the two stepped guide slots 24 for positioning of the two conductive plates 52 respectively. Three triangular block retainer sets 28 are respectively disposed on the inner side walls of the casing 2 for positioning of the cover plate 3 on the casing 2. Each triangular block retainer set 28 is comprised of three triangular shaped projections extending from the inner surface of the casing wall.

A ring-shaped portion 26 is formed at the bottom of the casing 2 to define a corrugated inner ring surface 261 and a centrally located through hole 262. A volume control knob 6 is mounted on the casing 2 through the center hole 262 by means of two resilient retainer stubs 61. The two resilient retainer stubs 61 of the volume control knob 6 each have a respective raised triangular top face. Thus, when the volume control knob 6 is mounted on the casing 2, the two resilient retainer stubs 61 are inserted through the center hole 262 of the ring-shaped portion 26 and a centrally located through hole 73 of a circular matching plate 7. The circular matching plate 7 being firmly retained by the two raised triangular top faces of the two resilient retainer stubs 61.

The matching plate 7 includes two upward extensions 74 bilaterally disposed adjacent the center hole 73. Each extension 74 is provided with a horizontally disposed bottom arm 71 which is firmly in contact with the corrugated inner ring surface 261 to provide a detent type sliding effect. A control leaf 72 is disposed on the top of the two upward extensions 74 for coupling to the variable resistor of the circuit board 5. Therefore, the volume which is output through a loudspeaker aperture 29 formed in casing 2 is controlled by revolving the volume control knob 6 to in turn drive the control leaf 72 and thereby the shaft of the variable resistor mounted on circuit board 5.

Further, a circular block 27 is disposed on the bottom of casing 2, having a round through hole 271 formed at the center of circular block 27 for insertion therethrough of the two resilient retainer stubs 81 of knob 8. The two resilient retainer stubs 81 of knob 8 are inserted through the round through hole 271 formed in circular block 27, and are further inserted through the centrally located through hole 91 of a circular matching plate 9 to firmly retain the matching plate 9, such that manual rotation of the shift rod 82 extending from the body of knob 8 rotatively drives the matching plate 9. Matching plate 9 includes a pair of vertically extended projections 92, positioned adjacent to, and on opposing sides of through hole 91 for coupling with a three position selector switch 16 mounted on circuit board 5.

The cover plate 3 comprises an internally disposed recessed channel 31 adapted to mate with the flange 21 of casing 2, and further includes three leg sets 32 adapted to mate with the three triangular block retainer sets 28, respectively. Each leg set 32 is comprised of two hook-shaped legs extending from cover plate 3 for locking engagement with the central and largest block of the associated triangular block retainer set 28. A set of locating ribs 36 are also formed on the cover plate 3 extending around and adjacent to the periphery for positioning of the circuit board 5.

One set of lugs 35 are formed on the cover plate 3 at one end, corresponding to the two stepped guide slots 24 of the casing 2, to firmly hold the two conductive plates 52 when the cover plate 5 is mated with the casing 2. A protruding side wall 33 of the cover plate 3 is extended downwardly to mate with the compartment 22 of the casing 2, and provided with two notches 34 for receiving a pair of tenons 41 extending from front cover 4.

The front cover 4 is provided with a plurality of indentations 42 formed on a side opposite the tenons 41, for mating with the guide notches 23 of casing 2. The front cover 4 is removably mounted on the casing 2 by a pair of bilateral hook portions 43 extending from the front cover 4. The hook portions 43 are arranged to releasably lockingly engage the bottom of guide notches 23 on opposing respective ends. By means of this arrangement, the circuit board 5 is securely held in the casing 2 and covered by the cover plate 3 and the front cover 4 with the two conductive plates 52 extending beyond the casing 2 for making the power connection. Therefore, no power cord is required.

Figure 3:
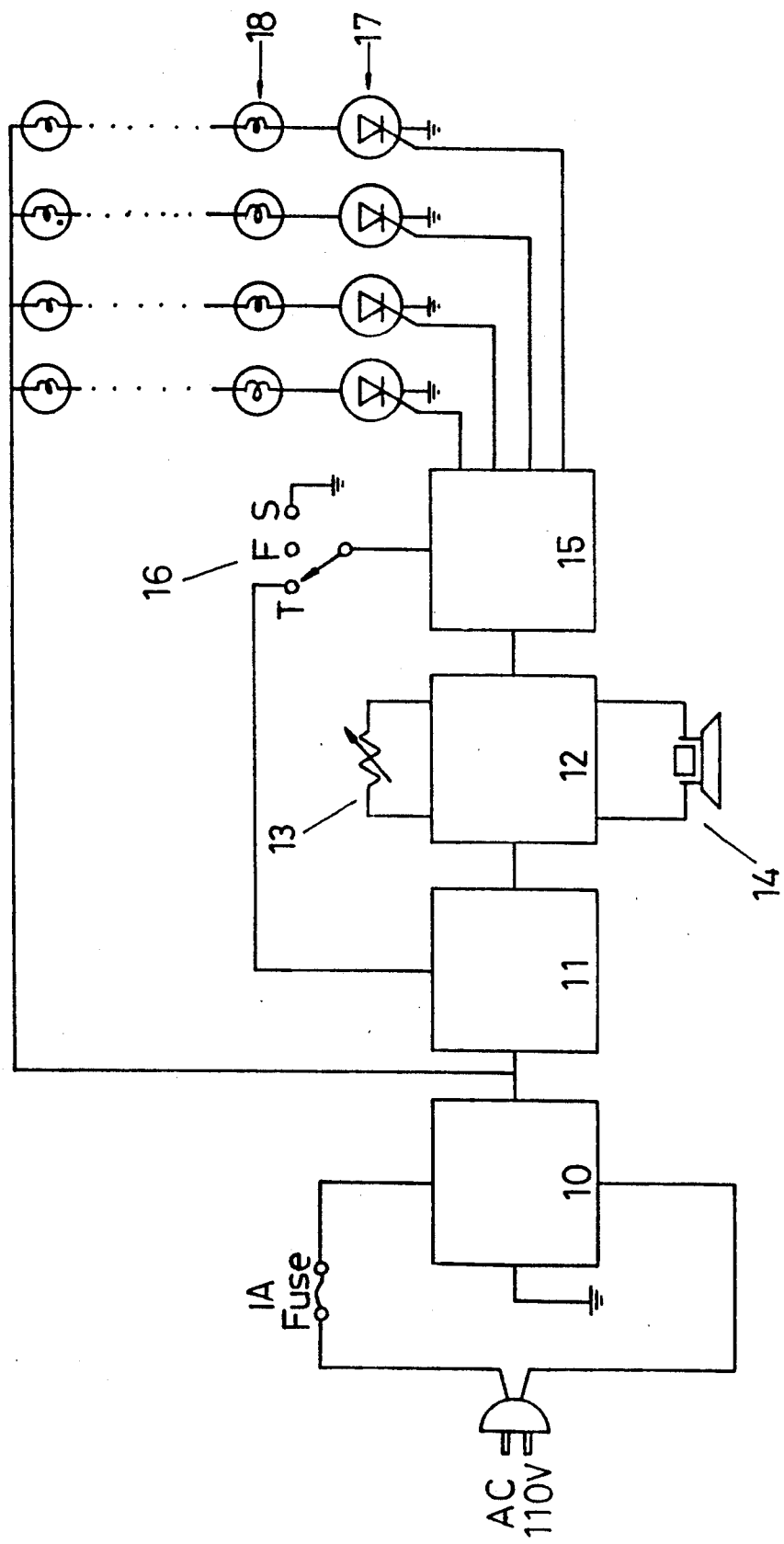
FIG. 3 is a circuit block diagram of the present invention.
Figure 4:
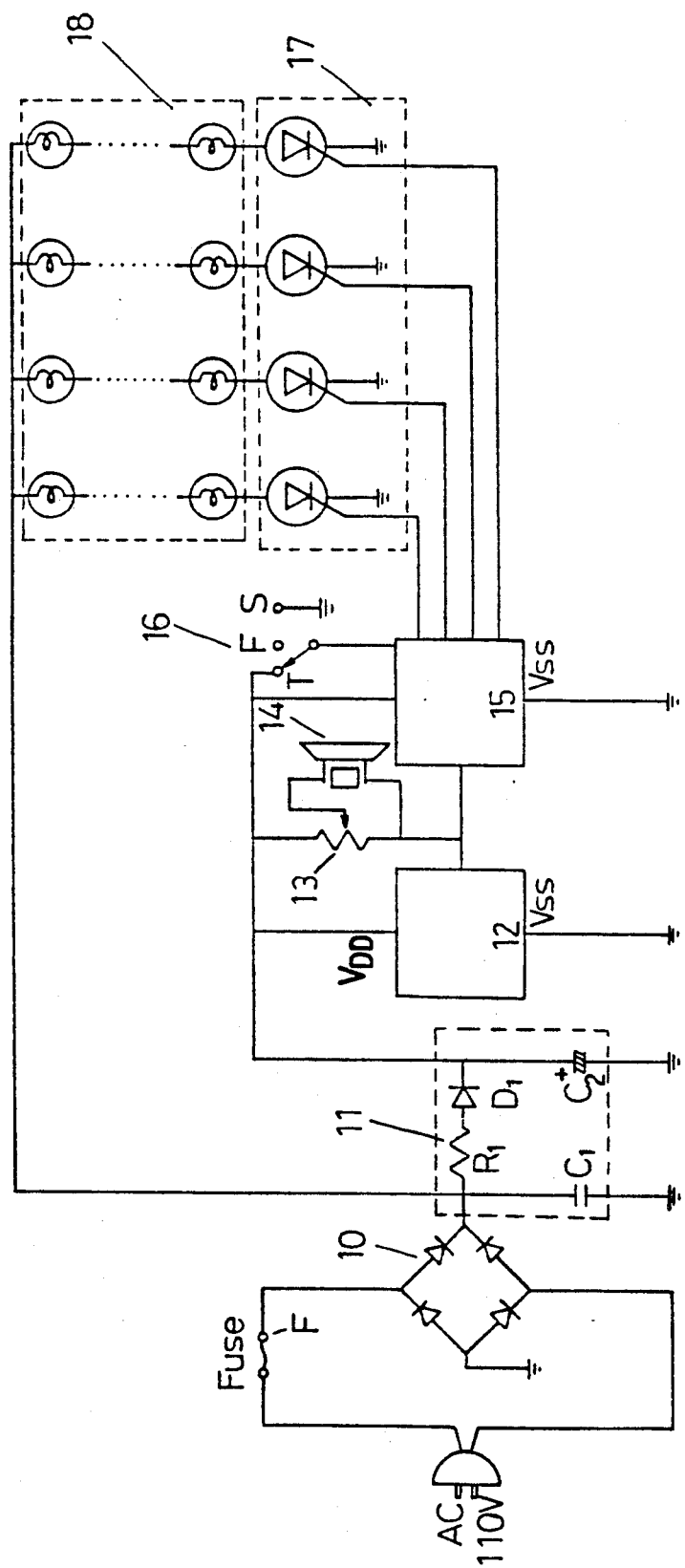
FIG. 4 is a circuit diagram of the present invention.

Referring to FIGS. 3 and 4, the circuit arrangement disposed on circuit board 5 includes bridge rectifier 10, voltage regulating circuit 11, music IC 12, variable resistor 13, piezo-electric buzzer 14, alternative switch IC 15, selector switch 16, thyristors 17, and light sets 18. AC power is coupled through a fuse to the bridge rectifier 10 for full-wave rectification of the AC signal. The output of rectifier 10 is a DC pulse signal which is coupled to one end of the light sets 18 and the voltage stabilizing circuit 11, respectively.

The voltage regulating circuit 11 is comprised to two capacitors C1 and C2, capacitor C1 being connected in parallel relation with the input to regulating circuit 11 and capacitor C2 being connected in parallel with the output. The capacitors are serially coupled by a resistor R1 and a diode D1. Voltage regulating circuit 11 functions to lower the voltage and filter the current supplied from the bridge rectifier 10, and thereby provides the music IC 12 with a stable DC voltage and a DC voltage signal for selective input to the alternative switch IC 15.

The music IC 12 contains a prestored music program contained in an internal non-volatile memory. The music IC 12 is coupled to a piezo-electric transducer 14 for output of the programmed music through the loudspeaker aperture. The piezo-electric transducer 14 is serially connected with a variable resistor 13 to provide volume control responsive to the volume control knob 6. When the music IC 12 is triggered there is provided a musical output signal to transducer 14 and simultaneously a series of pulses whose timing is responsive to the music signal, coupled to the alternative switch IC 15.

The alternative switch IC 15 includes four output terminals, each connected to the gate of a respective one of the four thyristors 17. The negative pole of the thyristors 17 is connected to the circuit ground, or return, and the positive pole is respectively connected to a light set of specific color or orientation. When the output of either one of the four gates of the alternative switch IC 15 is a high level, a 5 V voltage is coupled to the gate of the corresponding thyristor 17 to trigger it "ON". Even if the voltage at the gate is returned to a zero potential, the thyristor will remain "ON" and will not be turned off until the DC pulse from the full-wave bridge rectifier equals zero volts. Therefore, the various light sets are alternatively turned on/off according to a time sequence.

The selector switch 16 is serially connected between the voltage stabilizing circuit 11 and the alternative switch IC 15. Selector switch 16 is a three-position switch whose contact arrangement is switched by the turning knob 8 to provide for three different lighting states. When the switch 16 is shifted to position T, the light sets will follow the rhythm of the music to alternatively twinkle; if the switch is shifted to position F, the light sets will follow the rhythm of the music to alternately flash; or if shifted to position S, all the light sets will be steadily turned on to provide illumination. Flashing of the lamps is differentiated from the twinkle mode by the length of time the lamps are illuminated, the twinkle being of substantially shorter duration than the flash.

In conclusion, the present invention provides a music initiated Christmas light set controller having numerous features, each of which tends to make the structure more practical in function, more economic in AC power consumption, more durable in use, and less expensive to manufacture. In addition to use with Christmas music for Christmas decoration, the present invention is also very practical for use at dancing parties, birthday parties or the like, to produce amusement and an appealing illuminating effect.

What is claimed is:

1. A music initiated Christmas light set controller electrically coupled to an alternating current power source for selectively energizing a plurality of Christmas light sets, comprising:

a housing formed by a casing having one open end portion and an open top portion, a cover plate for locking engagement with said casing to form a closure for said open top portion, and a front cover for releasable locking engagement with said casing to form a removable closure for said open end;

a circuit board disposed within said housing having at least a pair of input terminations for receiving an input voltage signal from said power source and a plurality of output terminatins for coupling output energization signals to said light sets;

a bridge rectifier circuit disposed on said circuit board and being electrically coupled to said input terminations for generating a pulsating direct current signal, said pulsating direct current signal being coupled to a first terminal of each of said plurality of light sets;

a voltage regulating circuit disposed on said circuit board having an input coupled to said bridge rectifier circuit for both filtering and reducing an amplitude value of said pulsating direct current signal;

a music generating circuit disposed on said circuit board and coupled to said voltage regulating circuit for generating (1) a musical output signal, and (2) a serial timed pulse output signal, said musical output signal being coupled to a transducer for converting said musical signal to an acoustic signal;

an alternative switching circuit disposed on said circuit board and having a first input coupled to said music generating circuit for receipt of said serial timed pulses, said alternative switching circuit having a second input coupled to a three position switch for selecting one of three energization schemes for said plurality of Christmas light sets; and thyristor circuit means for energizing said light sets disposed on said circuit board, said thyristor circuit means having (1) a plurality of gate inputs coupled to respective outputs of said alternative switching circuit, (2) a plurality of anode terminals, each of said anode terminals being coupled to a respective one of said light sets, and (3) a plurality of cathode terminals commonly coupled to a return lead of said bridge rectifier circuit, whereby said light sets are periodically energized at one of two selected rates responsive to a rhythm of said musical output signal as provided by said serial timed pulse output signal, or selectively continuously energized.

2. The music initiated Christmas light set controller as recited in claim 1 wherein said music generating circuit includes a memory having a music program stored therein.

3. The music initiated Christmas light set controller as recited in claim 1 wherein said voltage regulating circuit includes a first capacitor coupled in parallel relation with said input from said bridge rectifier circuit, and a second capacitor coupled in parallel relation with an output of said voltage regulating circuit.

4. The music initiated Christmas light set controller as recited in claim 3 wherein said voltage regulating circuit further includes a resistor and a diode coupled in series relation between said input and said output of said voltage regulating circuit.

5. The music initiated Christmas light set controller as recited in claim 1 wherein said music generating circuit transducer is a piezo-electric device serially coupled to said musical output signal by a variable resistor for controlling the volume of said acoustic signal.

6. The music initiated Christmas light set controller as recited in claim 1 wherein said three energization schemes defining (1) a twinkle effect responsive to a first of said two energization rates, (2) a flashing effect responsive to a second of said two energization rates, and (3) a continuous effect responsive to said continuous energization of said light sets.

* * * * *